United States Patent [19]

Shinohe et al.

[11] Patent Number: 4,717,940
[45] Date of Patent: Jan. 5, 1988

[54] MIS CONTROLLED GATE TURN-OFF THYRISTOR

[75] Inventors: Takashi Shinohe; Katsuhiko Takigami; Hiromichi Ohashi, all of Yokohama; Akio Nakagawa, Hiratsuka, all of Japan

[73] Assignee: Kabushiki Kaisha Toshiba, Kawasaki, Japan

[21] Appl. No.: 14,608

[22] Filed: Feb. 13, 1987

[30] Foreign Application Priority Data

Mar. 11, 1986 [JP] Japan .................. 61-53103
Nov. 21, 1986 [JP] Japan .................. 61-277952

[51] Int. Cl.⁴ ........................................... H01L 29/74
[52] U.S. Cl. ..................... 357/38; 357/23.4; 357/43; 357/89; 357/91
[58] Field of Search ............ 357/23.4, 38, 38 G, 357/38 T, 43, 58, 89, 91

[56] References Cited

U.S. PATENT DOCUMENTS

| | | | |
|---|---|---|---|
| 4,062,032 | 12/1977 | Neilson | 357/58 |
| 4,177,478 | 12/1979 | Senes | 357/38 |
| 4,224,634 | 9/1980 | Svedberg | 357/23.4 |
| 4,291,325 | 9/1981 | Sueoka et al. | 357/38 |
| 4,574,296 | 3/1986 | Sueoka et al. | 357/89 |
| 4,587,713 | 5/1986 | Goodman et al. | 357/43 |

FOREIGN PATENT DOCUMENTS

| | | | |
|---|---|---|---|
| 28797 | 5/1981 | European Pat. Off. | 357/38 T |
| 3,447,220 | 7/1985 | Fed. Rep. of Germany | 357/38 T |
| 53-66384 | 6/1978 | Japan | 357/38 G |
| 54-120588 | 9/1979 | Japan | 357/38 G |
| 56-80165 | 7/1981 | Japan | 357/38 T |
| 57-78172 | 5/1982 | Japan | 357/38 G |
| 59-47469 | 11/1984 | Japan | . |
| 60-9668 | 3/1985 | Japan | . |

OTHER PUBLICATIONS

IEEE IEDM Tech. Digest (1984), pp. 282–285, V. A. K. Temple.
IEEE IEDM Tech. Digest (1985), pp. 158–161, M. Stoisiek et al.

*Primary Examiner*—Joseph E. Clawson, Jr.
*Attorney, Agent, or Firm*—Oblon, Fisher, Spivak, McClelland & Maier

[57] ABSTRACT

An MIS controlled gate turn-off thyristor includes a pnpn structure comprised of a first emitter layer, a first base layer, a second base layer and a second emitter layer, and a turn-off MIS transistor for short-circuiting the second base layer to the second emitter layer. A low impurity concentration layer is formed on the second base layer and the second emitter layer is so formed that it extends, through the low impurity concentration layer, into the second base layer. The MIS transistor is formed on the surface portion of said low impurity concentration layer.

11 Claims, 23 Drawing Figures

MIS CONTROLLED GATE TURN-OFF
THYRISTOR

BACKGROUND OF THE INVENTION

This invention relates to a gate turn-off thyristor which can be controlled in turn-off by an integrated MIS transistor.

A gate turn-off thyristor (hereinafter referred to as a GTO) is usually so formed that it is turned off by applying a negative bias to a gate electrode to allow a portion of an anode current to be externally drawn as a gate current. The turn-off operation of such an ordinary GTO is of a current control type, requiring a fairly great gate power. It is known that an MIS transistor by which gate-to-cathode can be shorted in turn-off is monolithically formed within the GTO. This type of the GTO is known, for example, as an MIS controlled GTO. For easiness in explanation, this GTO is hereinafter referred to as merely as an MIS GTO. The MIS GTO requires a smaller gate power for turn-off, because its operation is of a voltage-controlled type. There are two types of MIS GTO, one is using an n-channel MIS transistor (for example, Japanese Patent Publication (Kokoku) No. 59-47469) and the other is using a p-channel MIS transistor (for example, Japanese Patent Publication (Kokoku) No. 60-9668). In the n-channel MIS transistor, the surface portion of a p-base layer in the GTO is used as a channel region and an additional n-type layer is formed within the p-base layer such that it acts as one of source and drain regions. And in the p-channel MIS transistor, the surface portion of the periphery of an n-emitter layer in the GTO is used as a channel region and a p-type layer is formed within the n-emitter layer such that it acts as one of the source or drain regions. In the MIS GTO, when the MIS transistor is rendered on, then, a portion of an anode current is bypassed through the MIS transistor. Where the channel conductance of the MIS transistor is greater than a given value, then most of an anode current flows into the cathode electrode through a bypass. As a result, a quantity of electrons injected from the n-emitter layer into the p-base layer is decreased, failing to maintain the GTO in an on-state, so that the GTO is shifted to the off-state.

A maximum anode current level (peak turn-off current level) $I_{TGQM}$, at which the MIS GTO can be turned off, depends upon a resistance $R_S$ of the bypass which is formed when the MIS transistor of turned on. The maximum anode current level is given below:

$$I_{TGQM} = G_{OFF} V_{NP}/R_S \quad (1)$$

where $V_{NP}$: a voltage drop, in the on-state, of an emitter junction formed between the second base layer and the second emitter layer, as given by about 0.8 V; and $G_{OFF}$: a gate turn-off gain as given by a ratio of the anode current to the gate current at the gate turn-off time.

The resistance $R_S$ is expressed as follows:

$$R_S = R_{ON} + R_L + R_V \quad (2)$$

where $R_{ON}$: the ON resistance of the MIS transistor;

$R_L$: the lateral resistance of the second base layer under the second emitter layer; and $R_V$: the vertical resistance of said second base layer.

As evident from the above, it is important to reduce the resistance $R_S$ so as to make the peak turn-off current $I_{TGQM}$ of the MIS GTO larger. In order to make the ON resistance $R_{ON}$ of the MIS transistor smaller it is desirable that the channel length of the MIS transistor be made as small as possible and that the channel width of the MIS transistor be made as great as possible. In order to make the resistances $R_L$ and $R_V$ of the second base layer smaller, it is desirable that the whole length of the aforementioned bypass be shortened through the microminiaturization of respective regions of the element and that the impurity concentration level of the second base layer be made higher. Of these requirements, the shape and dimension requirement can readily be met by a recently developed microminiaturization technique. It is, however, difficult to increase the impurity concentration level of the second base layer in view of its relation to the element characteristics. That is, the MIS GTO requires an emhancement type MIS transistor of a proper threshold voltage. It is, therefore, necessary that the impurity concentration level of the second base layer which is used as a channel region of the MIS transistor be maintained at a level lower than about $10^{17}/cm^3$. Therefore, the conventional method has been directed to reducing the dimension of the second emitter layer through a division and hence to reducing the resistance $R_L$. This results in a decrease in the effective area of the GTO element region in the MIS GTO element, an increase in the on-state voltage of the MIS GTO and a decrease in the surge current capability.

SUMMARY OF THE INVENTION

It is accordingly the object of this invention to provide an MIS GTO which has a greater surge current capability, a smaller on-state voltage and a greater peak turn-off current.

The MIS GTO of this invention is so configured that a low impurity concentration layer is formed on a second base layer and the second emitter layer is so formed as to extend, through the low impurity concentration layer, to the second base layer. A turn-off MIS transistor is so formed that the low impurity concentration layer is used as a channel region. The MIS GTO structure of this invention is classified into the following four types in connection with the channel type of the MIS transistor:

(1) A low impurity concentration layer of a first conductivity type is formed on a second base layer of the first conductivity type and a second channel conductivity type MIS transistor is formed with the surface portion of the low impurity concentration layer used as a channel region.

(2) A first low impurity concentration layer of the first conductivity type is formed on a second base layer of the first conductivity type and a second low impurity concentration layer of a second conductivity type is formed in the surface of the first low impurity concentration layer. An MIS transistor is of a first channel conductivity type and is formed with the surface portion of the second low impurity concentration layer used as a channel region.

(3) A low impurity concentration layer of the second conductivity type is formed on a second base layer of first conductivity type and the first channel conductivity type MIS transistor is formed with the surface portion of the low impurity concentration layer used as a channel region.

(4) A first low impurity concentration layer of the second conductivity type is formed on a second base layer of the first conductivity type and a second low impurity concentration layer of the first conductivity type is formed in the surface of the first low impurity concentration layer. An MIS transistor is of the second channel conductivity type which is formed with the surface portion of the second low impurity concentration layer used as a channel region.

According to this invention the threshold voltage of the MIS transistor can be set independently of the impurity concentration level of the second base layer. Stated in another way, the second base layer is formed as a high impurity concentration layer of a smaller resistance and the MIS GTO element is so formed as to have a greater width, thereby making the effective area of the GTO element region greater. By so doing, it is possible to obtain a greater peak turn-off current without causing an increase in the on-state voltage and a decrease in the surge current capability.

According to a preferred embodiment of this invention, a high impurity concentration layer of the same conductivity type as that of the second emitter layer is formed continuous with the second emitter layer such that it is located between the second base layer under the MIS transistor region and the low impurity concentration layer over the second base layer. Providing such a high impurity concentration layer is equivalent to eventually so forming the second emitter layer as to extend into the MIS transistor region. As a result, a greater effective conduction area can be maintained on the MIS GTO.

DETAILED DESCRIPTION OF THE PREFERRED EMBODIMENTS

The embodiments of this invention will be explained below with reference to the accompanying drawings.

Figure 1:
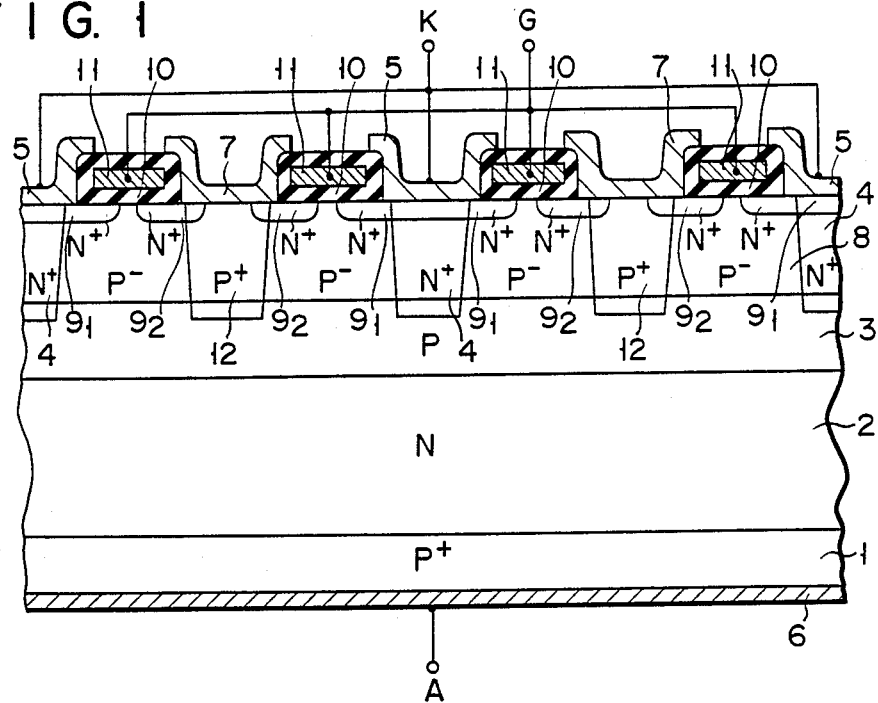
FIG. 1 is a cross-sectional view showing an MIS GTO according to a first embodiment of this invention.

Throughout the embodiments of this invention, the same reference numerals are employed to designate elements and layers corresponding to those shown in FIG. 1, noting that first conductivity type is p-type and second conductivity type is n-type.

FIG. 1 shows a MIS GTO according to the first embodiment of this invention. The MIS GTO is based on a pnpn structure comprised of first emitter layer 1 of $p^+$-type, first base layer 2 of n-type, second base layer 3 of p-type and second emitter layer 4 of $n^+$-type. $p^-$-type layer 8 of a low impurity concentration is formed on second base layer 3, noting that $p^-$-type layer 8 is formed by an epitaxial growth method or a counterdoping method. A wafer containing second base layer 3 and another wafer corresponding to $p^-$-type layer 8 are prepared which are directly bonded to each other to obtain an integral unit. Second emitter layer 4 extends through $p^-$-type layer 8 to provide a pn junction (emitter junction) between second emitter layer 4 and second base layer 3. Cathode electrode 5 and anode electrode 6 are formed on second emitter layer 4 and first emitter layer 1, respectively.

Turn-off n-channel MIS transistors are formed in $p^-$-type layer 8 to permit second emitter layer 4 to be sandwiched between the transistors. The MIS transistor is comprised of $n^+$-type layers $9_1$ and $9_2$ as source and drain regions, respectively, gate insulating film 10 formed on that surface of $p^{31}$-type layer 8 between $n^+$-type layers $9_1$ and $9_2$, and gate electrode 11 formed on the gate insulating film 10. $n^+$-type layer $9_1$ is so formed as to partially overlap with second emitter layer 4. Thus the source of the MIS transistor is connected to the cathode electrode 5. $p^+$-type layer 12 is so formed as to partially overlap $n^+$-type layer $9_2$ (drain region). On-gate electrode 7 is used as an electrode for allowing $n^+$-type layer $9_2$ and $p^+$-type layer 12 to be short-circuited to each other. $p^+$-Type layer 12 extends, through $p^-$-type layer 8, to second base layer 3 so that the drain of the MIS transistor is connected to second base layer 3 with a low resistance.

The MIS GTO thus formed is turned on and off in the same fashion as the conventional counterpart.

That is, a positive voltage is applied to on-gate electrode 7 and thus a forward bias is applied across second base layer 3 and second emitter layer 4, causing the MIS GTO to be turned on. The turn-off operation of the MIS GTO is performed by applying a positive voltage in excess of a threshold voltage to gate electrode 11 to cause the MIS transistor to be turned on.

According to this embodiment, p⁻-type layer 8, distinct from second base layer 3 of the MIS GTO, is formed, which provides a channel region for the turnoff MIS transistor. As a result, the impurity concentration levels of second base layer 3 and p⁻-type layer 8 can be separately set to an optimum value, depending upon the use of these layers. That is, p⁻-type layer 8 may be so set as to obtain a desirable threshold voltage on the MIS transistor. The impurity concentration of second base layer 3 can be set to a sufficiently high level without being restricted by the threshold voltage on the MIS transistor. To list numeric examples in practice, a lateral resistance $R_L$ of second base layer 3 can be set to substantially one-third that of a conventional counterpart. By so doing, with a peak turn-off current $I_{TGQM}$ fixed, the width of second emitter layer 4 can be set to substantially three times that of a conventional counterpart. In actual practice, however, since the area of the whole device is determined, the width of the second emitter layer is increased by decreasing the number of GTO elements while increasing the area of the respective GTO element. Where the second emitter layer is used for a stripe pattern, the increasing width of the second emitter layer is estimated as follows. If the actual area of the GTO element occupied by the GTO is 50%, the width of the emitter layer can be substantially doubled when $R_L/R_S=0.5$, i.e., when the width of the emitter layer is relatively large. When $R_L/R_S=0.1$, i.e., when the width of the emitter layer is small, the width of the emitter layer can be made about 1.14 times as large. Since the substantial area of the GTO is increased by an extent to which the width of the emitter layer is so increased, it is possible, according to this invention, to obtain a smaller on-state voltage and a greater surge current capability than those of the conventional counterparts. According to this invention, the following advantages can be gained. First, the high impurity concentration portion of a side wall portion of second emitter layer 4 is in contact with p⁻-type layer 8 and, at that portion, electrons are injected into p⁻-type layer 8 with a high injection efficiency. Second, second base layer 3 which is inwardly embedded relative to layer 8 can be made to have a high impurity concentration so that it can be made thinner. As a result, carriers injected from second emitter layer 4 become high in their transport factor. Third, the emitter junction is formed at that portion of second base layer 3 into which p⁻-type layer 8 extends, that is, at that portion having a flat impurity concentration distribution. Even if, therefore, an in-plane distribution is produced in the impurity diffusion of a plurality of second emitter layers 4, it is possible to obtain an emitter junction with a uniform depth. As a result, the npn transistor in the GTO has a uniform distribution of current amplification factor and the current amplification factor is maintained at a greater value.

As set forth above, p⁻-type layer 8 may be formed by an epitaxial growth, direct bonding or counter-doping method. Of these methods, the last two have a special effect. The direct bonding method is already known in the art and comprises intimately bonding the mirror-polished faces of two semiconductor substrates in a clean atmosphere, while keeping their bonding faces hydrophilic, and heat treating the resultant structure to provide a firmly bonded unit. The use of this technique allows the use of a (100) substrate as p⁻-type layer 8 and of a (111) substrate as second base layer 3. These substrates, being so bonded, can optimize the characteristic of the MIS transistor and characteristic of the GTO. The counter doping method can selectively form p⁻-type layer 8. By so doing, it is possible to obtain a high-withstand element through the utilization of a junction termination technique, such as a guard-ring method.

In this embodiment, second emitter layer 4 is formed such that it extends, through p⁻-type layer 8, into the second base layer 3. That is, the emitter junction is formed such that it is located at a place somewhat deeper than an interface between p⁻-type layer 8 and second base layer 3. As a result, the transport factor of the carriers in the second base layer is great, since there is no short carrier lifetime area in the effective second base layer, such as an interface with an epitaxial growth layer or an interface formed by a direct bonding. This allows the current amplification factor of the npn transistor in the GTO to be maintained great and hence contributes to obtaining a low on-state voltage.

In this embodiment, low-resistance p⁺-type layer 12 is so formed that it extends, through p⁻-type layer 8, into second base layer 3. In spite of the existence of high-resistance p⁻-type layer 8, therefore, the vertical resistance $R_V$ of the resistors on the aforementioned bypass resistance path can be made at a lower level.

Figure 2:
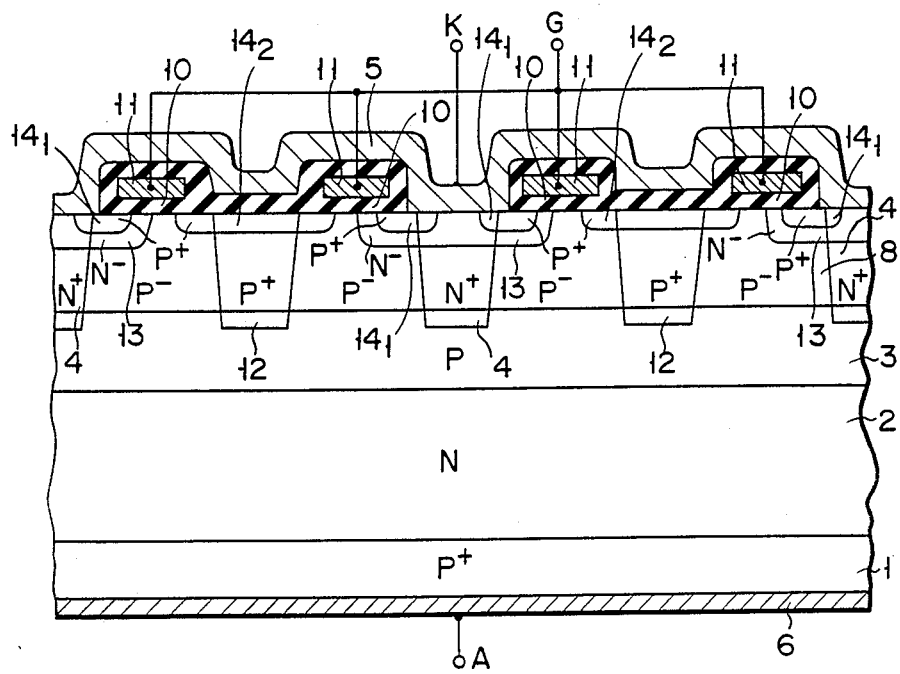
FIG. 2 is a cross-sectional view showing an MIS GTO according to a second embodiment of this invention.

FIG. 2 is a cross-sectional view showing an MIS GTO according to a second embodiment of this invention. In the embodiment shown in FIG. 2, p⁻-type layer 8 is formed as a low impurity concentration layer on second base layer 3 in the same fashion as set forth in connection with the preceding embodiment, and n⁻-type layers 13 are selectively formed as second low impurity concentration layers in the surface portion of p⁻-type layer 8. With the n⁻-type layer surface portion as a channel region, a p-channel MIS transistor is formed as a turn-off MIS transistor. That is, p⁺-type layers 14₂ and 14₁ are so formed as to sandwich the end face portion of n⁻-type layer 13. p⁺-Type layers 14₂ and 14₁ extend in and outside n⁻-type layer 13 to provide source and drain regions, respectively, of the MIS transistor. Second emitter layer 4 of the GTO partially overlaps with p⁺-type layer 14₁ (drain region) and is so formed that it extends, through n⁻-type layer 13 and p⁻-type layer 8, into second base layer 3 to provide an emitter junction relative to the second base layer. Cathode electrode 5 is connected to second emitter layer 4 and p⁺-type layer 14₁ in an ohmic contact fashion. p⁺-type layer (source region) 14₂ partially overlaps with p⁺-type layer 12 which is so formed as to extend into second base layer 3 in the thickness direction. As a result, p⁺-type layer 12 is low-resistively connected to second base layer 3.

In FIG. 2 a turn-on gate section is omitted, but in this connection use is made of, for example, a light-trigger system. An on-gate electrode which is in ohmic contact with p⁺-type layer 12 may be provided, as in the embodiment of FIG. 1. In the MIS GTO of this embodiment, the turn-off operation is performed by applying a negative voltage to gate electrode 11 to cause the MIS transistor to be turned on.

Even in this embodiment, a low impurity concentration layer is formed on the second base layer and thus the MIS transistor is constituted with the use of the low impurity concentration layer, obtaining the same advantage as in the preceding embodiment.

Figure 3:
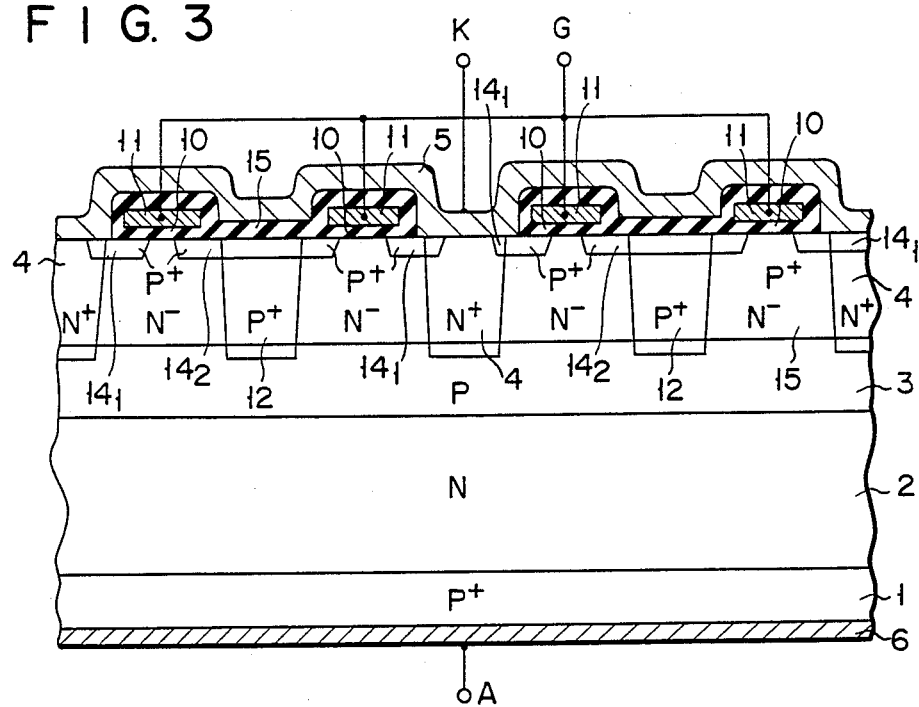
FIG. 3 is a cross-sectional view showing an MIS GTO according to a third embodiment of this invention.

FIG. 3 is a cross-sectional view showing an MIS GTO according to a third embodiment of this invention. In this embodiment, n⁻-type layer 15 of a conductivity type opposite to that of the second base layer 3 is formed as a low impurity concentration layer on second base layer 3. p⁺-Type layers 14₂ and 14₁ are formed in the surface portion of n⁻-type layer 15 to provide source and drain regions, respectively. Gate electrode 11 is formed over n⁻-type layer 15 between p⁺-type layers 14₁ and 14₂ with gate insulation film 10 formed between the gate electrode 11 and n⁻-type layer 15. In this embodiment, the p-channel MIS transistor with the surface portion of n⁻-type layer 15 used as a channel region is formed as a turn-off MIS transistor.

Second emitter layer 4 is so formed as to extend, through n⁻-type layer 15, into second base layer 3 in which case an emitter junction is formed relative to second base layer 3. Cathode electrode 5 is in ohmic contact with second emitter layer 4 and p⁺-type layer (the drain region of the MIS transistor) 14₁. P⁺-type layer (the source region) 14₂ is connected to second base layer 3 by low-resistance p⁺-type layer 12 which extends through n⁻-type layer 15. This arrangement is the same as that of the embodiment of FIG. 2. This embodiment can obtain the same advantage as those of the previous embodiments.

Figure 4:
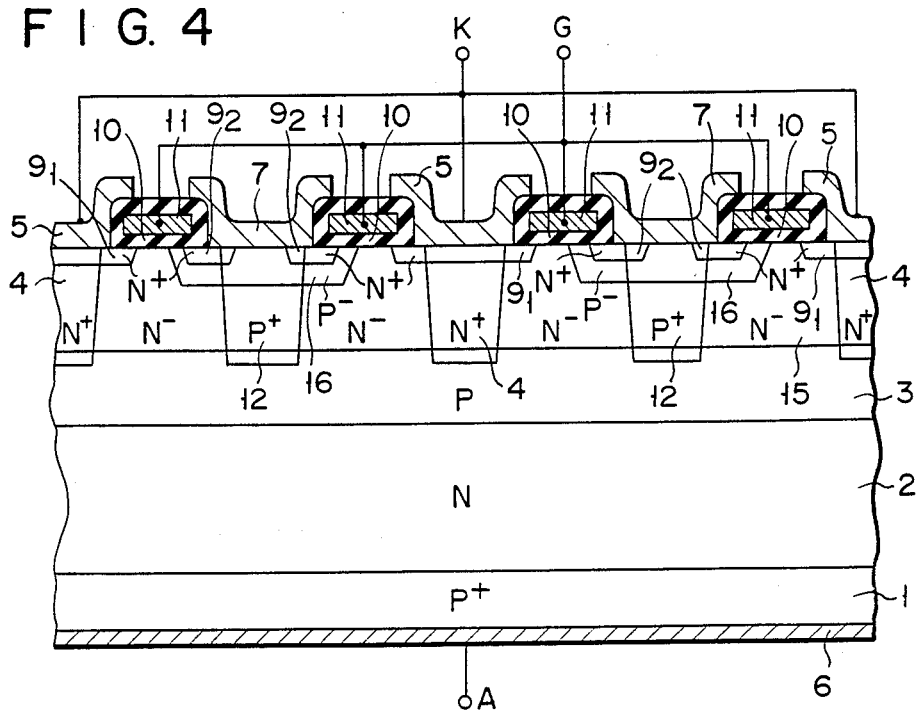
FIG. 4 is a cross-sectional view showing an MIS GTO according to a fourth embodiment of this invention.

FIG. 4 is a cross-sectional view showing an MIS GTO according to a fourth embodiment of this invention. In this embodiment, n⁻-type layer 15 is formed as a first low impurity concentration layer on Second base layer 3 and p⁻-type layer 16 is selectively formed, as a second low impurity concentration layer, in the surface portion of the n⁻-type layer 15 at a location adjacent to second emitter layer 4. An n-channel MIS transistor is thus formed with the surface portion of p⁻-type layer 16 as a channel region. n⁺-type layer 9₁ is formed, as a source region, outside p⁻-type layer 16 so that it partially overlaps with second emitter layer 4. n⁺-type layer 9₂ is formed as a drain region in p⁻-type layer 16. Gate electrode 11 is formed over that portion of p⁻-type layer 16 which is situated between the source and drain regions with gate insulation film 10 formed between the portion of p⁻-type layer 16 and gate electrode 11. p⁺-type layer 12 is so formed as to extend, through p⁻-type layer 16 and n⁻-type layer 15, into second base layer 3. ON gate electrode 7 is in ohmic contact with p⁺-type layer 12 and n⁺-type layer 9₂. n⁺-type layer (drain region) 9₂ is low-resistively connected through on-gate electrode 7 and p⁺-type layer 12 to second base layer 3.

This embodiment can gain the same advantages as set forth in connection with the previous embodiments of this invention.

Since, in a conventional GTO, an anode current concentrates into respective divided cathode regions the gate region never substantially contributes to conduction. The same thing can also be said of the MIS GTO. Almost no anode current flows through the MIS transistor region, thus offering a bar in obtaining a sufficiently low on-state voltage. This drawback can be solved as set forth in connection with the following embodiments.

Figure 5:
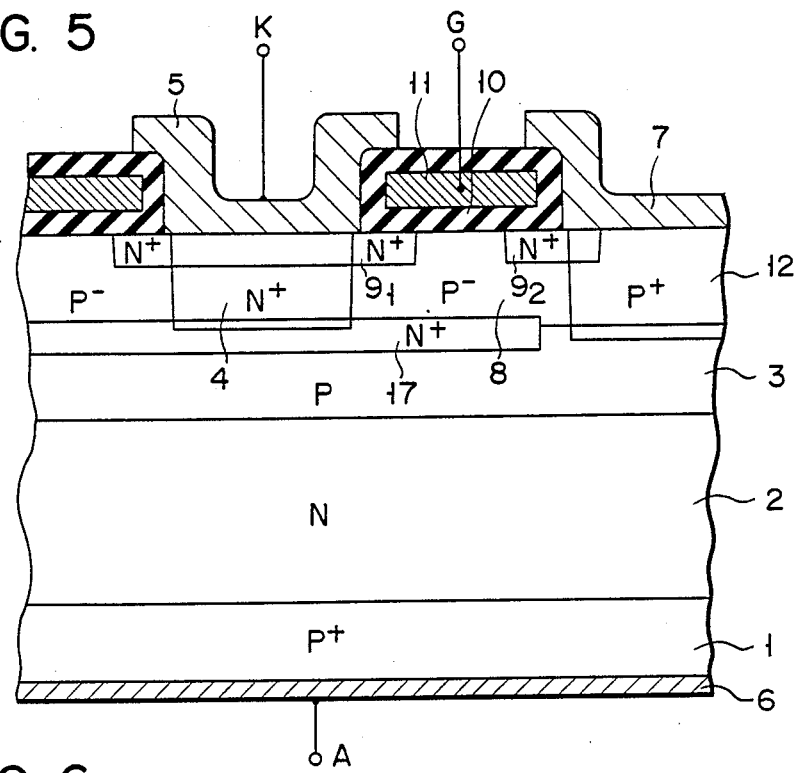
FIG. 5 is a cross-sectional view showing an MIS GTO according to a fifth embodiment of this invention.

FIG. 5 is a cross-sectional view showing a major section of a fifth embodiment, i.e., a modification of the MIS GTO shown in FIG. 1. The fifth embodiment is different from the embodiment of FIG. 1 in that n⁺-type embedded layer 17, continuous with second emitter layer 4, is formed at an interface between second base layer 3 and p⁻-type layer 8. In this connection, it is to be noted that n⁺-type embedded layer 17 is selectively formed under the gate region of the MIS transistor.

In this arrangement, n⁺-type embedded layer 17 permits second emitter layer 4 to extend substantially under the MIS transistor region. That is, n⁺-type layer 17 functions as part of the second emitter. Thus an MIS GTO is obtained which has a greater effective turn-on area and hence a sufficiently low on-state voltage.

Figure 18:
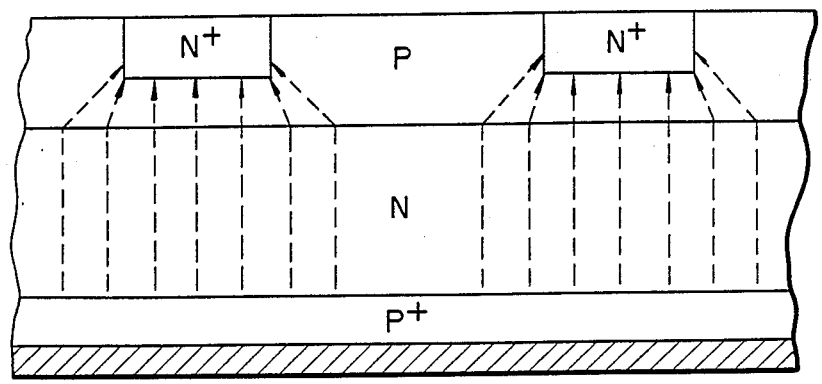
FIGS. 18 and 19 are views for comparing the state of an anode current flowing through a conventional MIS GTO and that of an anode current flowing through the MIS GTO of the embodiment shown in FIG. 5.
Figure 19:
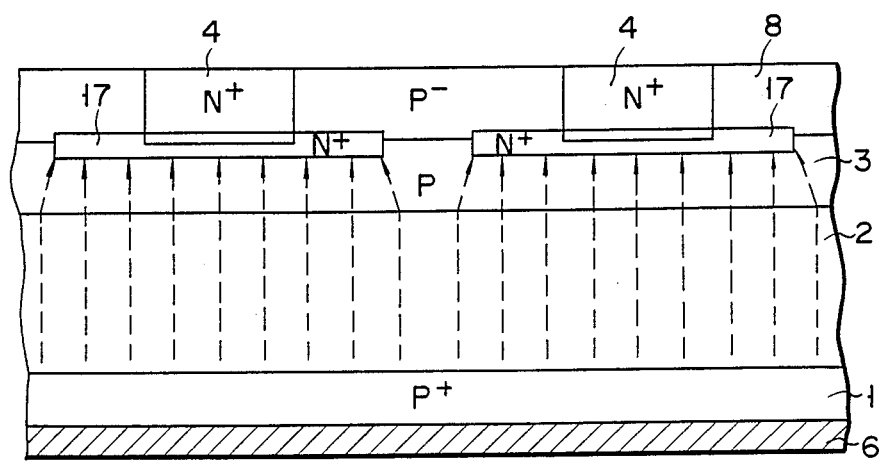

FIGS. 18 and 19 show a comparison between an anode current (broken line) in two adjacent emitter layer portions in a conventional MIS GTO and that in two adjacent emitter layer portions in the embodiment shown in FIG. 5. As appreciated from FIGS. 18 and 19, the turn-on area is substantially increased due to the existence of n⁺-type embedded layer 17.

Figure 6:
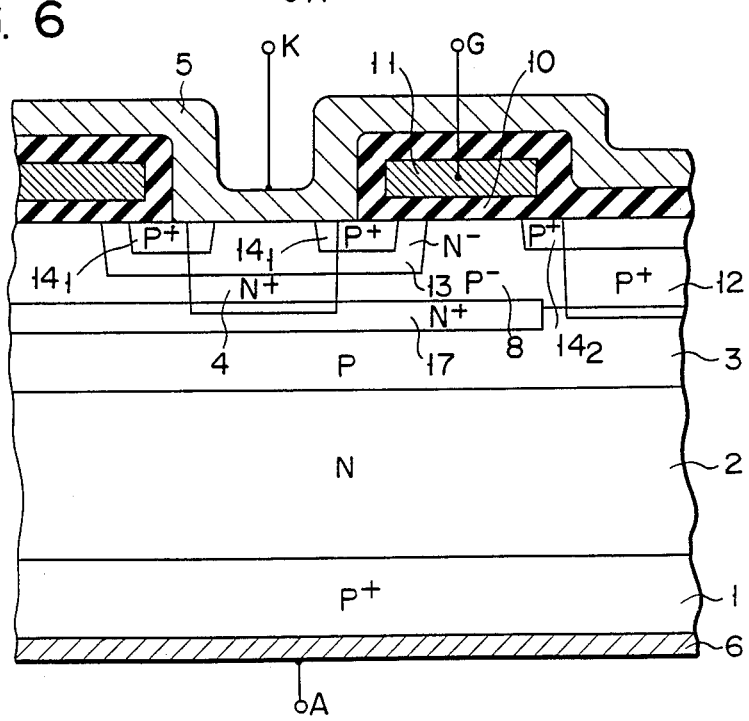
FIG. 6 is a cross-sectional view showing an MIS GTO according to a sixth embodiment of this invention.
Figure 7:
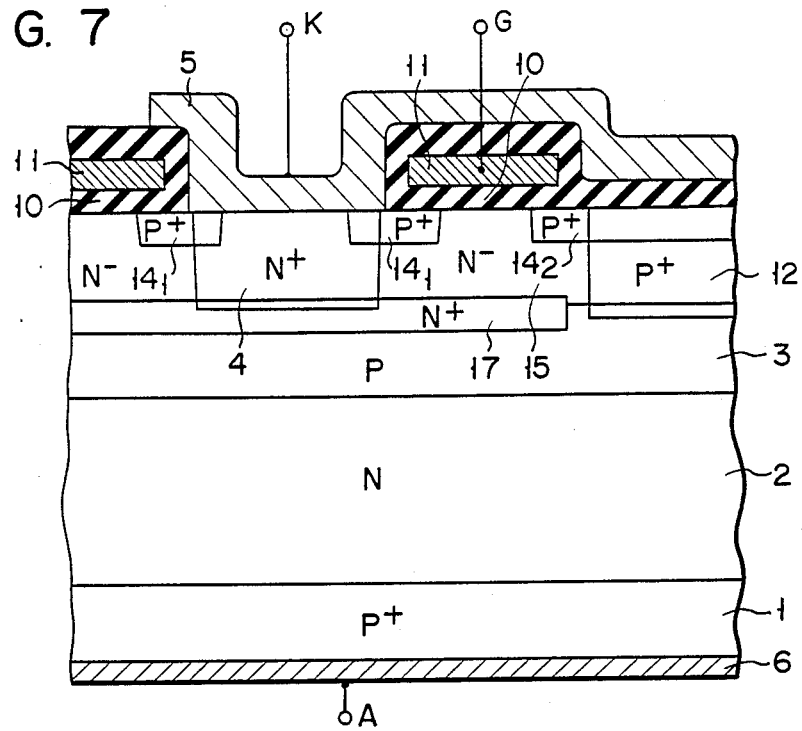
FIG. 7 is a cross-sectional view showing an MIS GTO according to a seventh embodiment of this invention.
Figure 8:
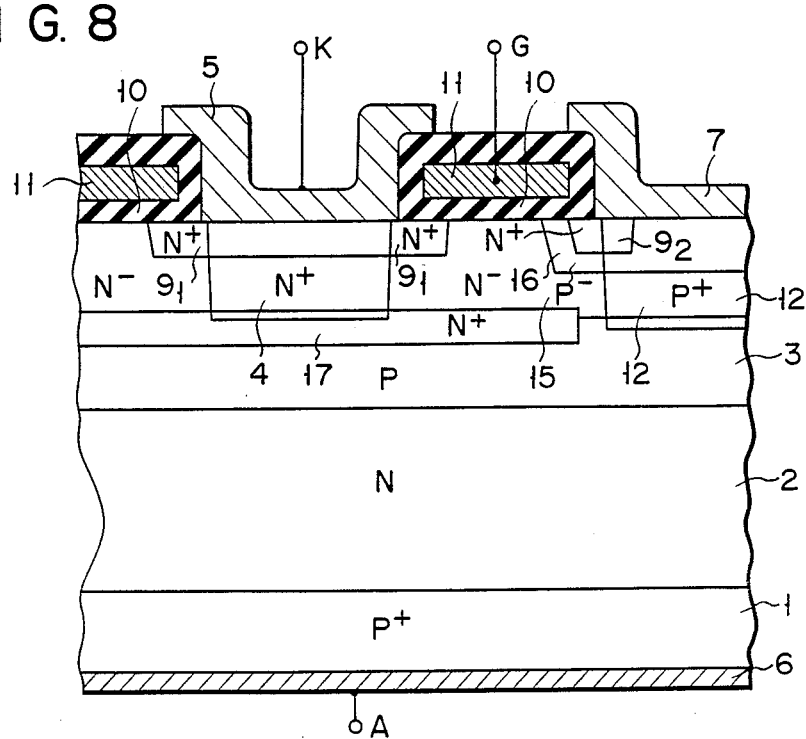
FIG. 8 is a cross-sectional view showing an MIS GTO according to an eighth embodiment of this invention.

FIG. 6 shows a sixth embodiment which is obtained by adding n⁺-type embedded layer 17 to an interface between second base layer 3 and p⁻-type layer 8 in the MIS GTO shown in FIG. 2. FIG. 7 shows a seventh embodiment which is obtained by adding n⁺-type embedded layer 17 to an interface between second base layer 3 and n⁻-type layer 15 in the MIS GTO shown in FIG. 3. FIG. 8 shows an eighth embodiment of this invention which is obtained by adding n⁺-type embedded layer 17 to an interface between second base layer 3 and n⁻-type layer 15 in the MIS GTO shown in FIG. 4. In FIG. 6 to FIG. 8, n⁺-type embedded layer 17 is locally formed over a range from the second emitter region to the MIS transistor region as in the embodiment shown in FIG. 5. The embodiments of FIGS. 6 to 8 can obviously obtain the same advantages as in the embodiment of FIG. 5.

Figure 9A:
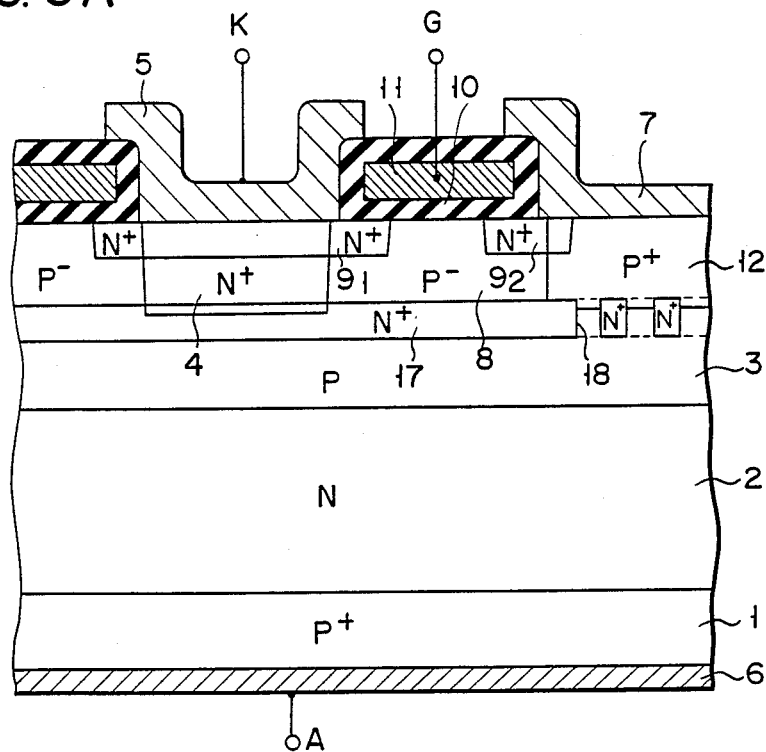
FIG. 9A is a cross-sectional view showing an MIS GTO according to a ninth embodiment of this invention and FIG. 9B shows a superimposition pattern of the semiconductor layer of a major section of the MIS GTO shown in FIG. 9A.
Figure 9B:
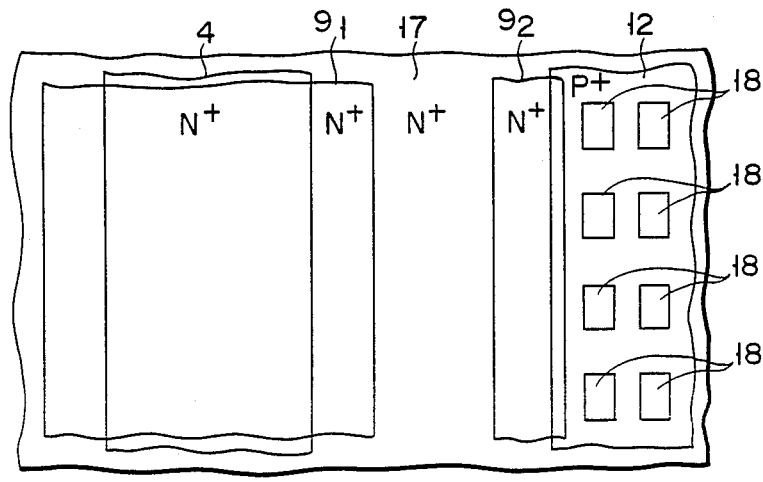

FIG. 9A is a cross-sectional view of an MIS GTO of a ninth embodiment of this invention, i.e., a modification of the MIS GTO shown in FIG. 5. In this embodiment, n⁺-type embedded layer 17 is so formed as to extend over a whole range of the interface between second base region 3 and p⁻-type layer 8, noting that a plurality of windows 18 are formed in the area of n⁺-type embedded layer 17, situated relative to p⁺-type layer 12, because of the need to obtain an electrical conduction between p⁺-type layer 12 and second base layer 3. FIG. 9B shows a superimposition pattern of respective impurity-doped layers in the MIS GTO.

Figure 10A:
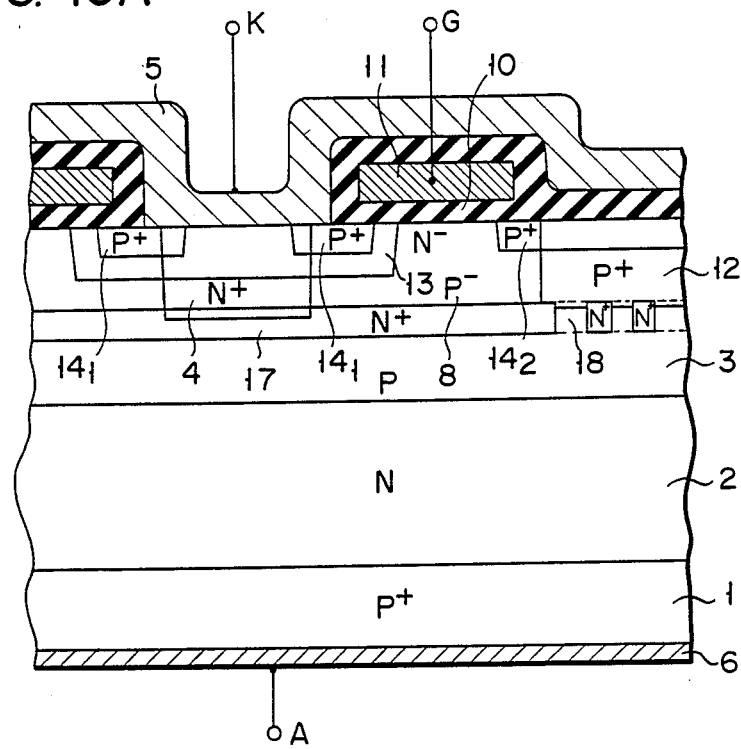
FIG. 10A is a cross-sectional view showing an MIS GTO according to a tenth embodiment of this invention and FIG. 10B is a view showing a superimposition pattern of the semiconductor layer of a major section of the MIS GTO shown in FIG. 10A.
Figure 10B:
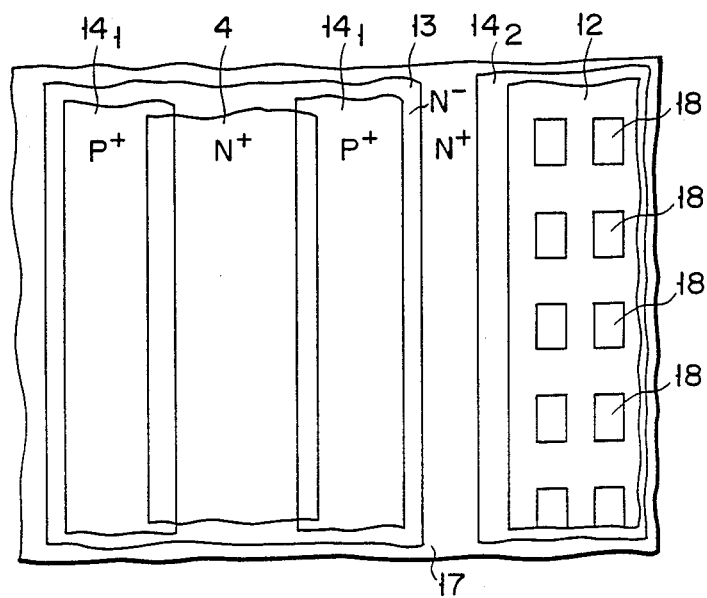

FIG. 10A is a cross-sectional view of a tenth embodiment of this invention, i.e., a modification of the MIS GTO shown in FIG. 6. Even in this embodiment, n⁺-type embedded layer 17 having a plurality of windows 18 is formed over a range of the interface between second base layer 3 and p⁻-type layer 8. FIG. 10B shows a superimposition pattern of respective impurity-doped layers in this MIS GTO.

Figure 11:
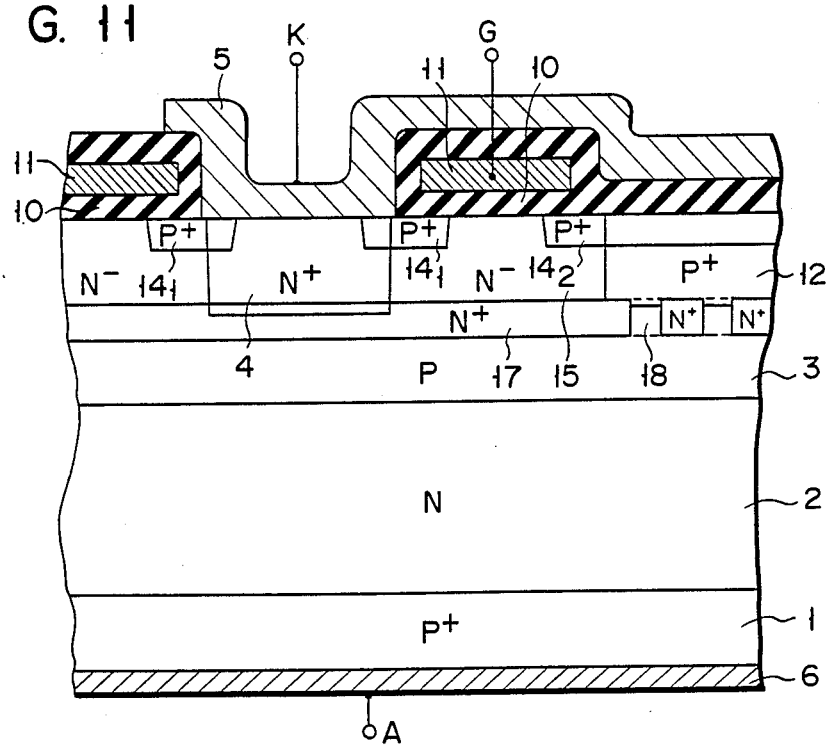
FIG. 11 is a cross-sectional view showing an MIS GTO according to an eleventh embodiment of this invention.
Figure 12:
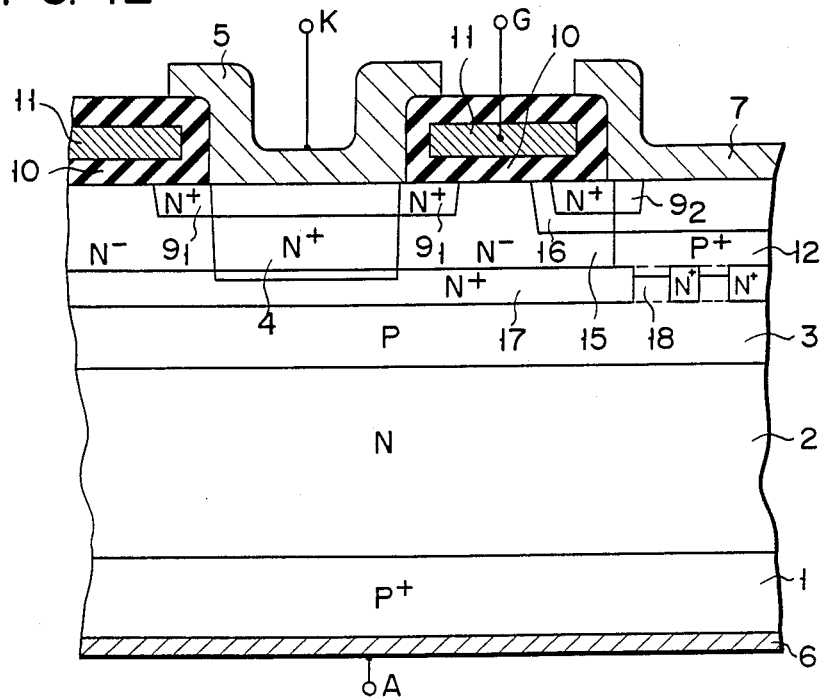
FIG. 12 is a cross-sectional view showing an MIS GTO according to a twelfth embodiment of this invention.

FIG. 11 is a cross-sectional view of an eleventh embodiment of this invention, i.e., a modification of the MIS GTO shown in FIG. 7. FIG. 12 is a cross-sectional view of a twelfth embodiment of this invention, i.e., a modification of the MIS GTO shown in FIG. 8.

According to the ninth through twelfth embodiments, a lower on-state voltage can be obtained since n⁺-type embedded layer 17 is formed over an even wider area than in the fifth through eighth embodiments.

Figure 13A:
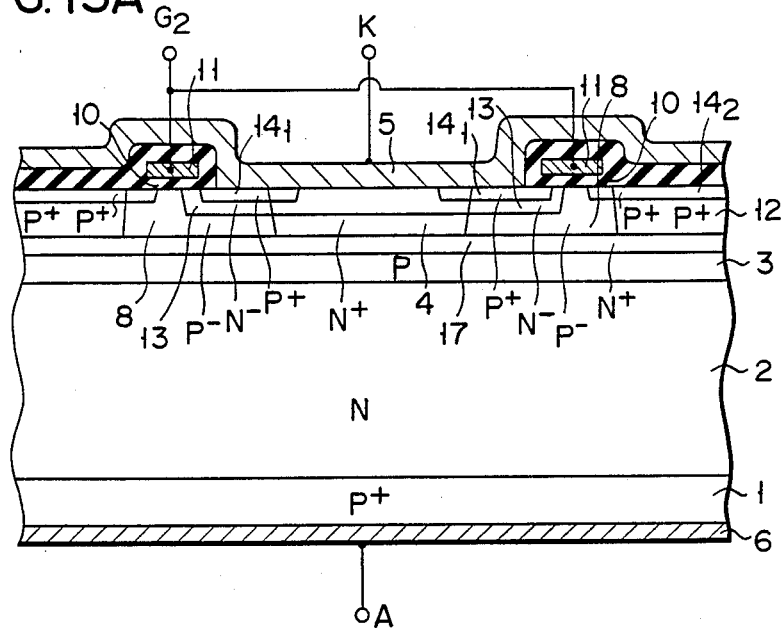
FIGS. 13A and 13B show an MIS GTO according to a thirteenth embodiment of this invention and FIG. 13C shows a superimposition pattern of the semiconductor layer of a major section of the MIS GTO shown in FIG. 12.
Figure 13B:
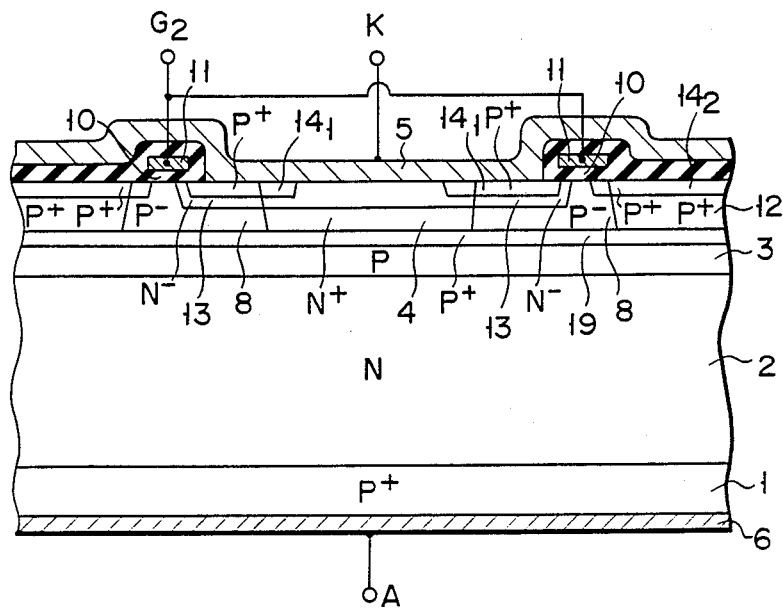
Figure 13C:
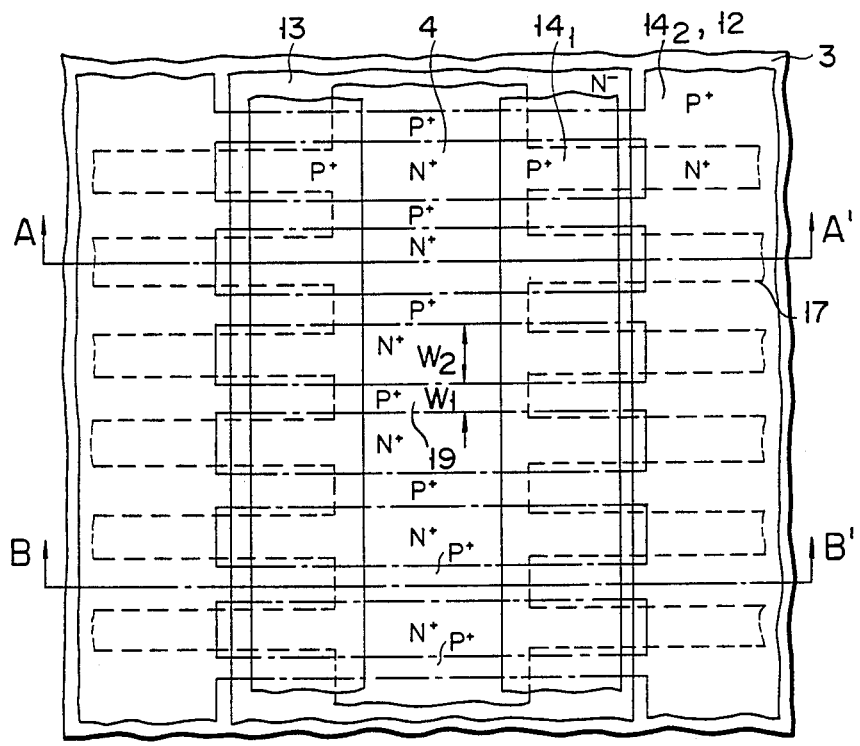

FIGS. 13A to 13C show an MIS GTO according to a thirteenth embodiment of this invention, which includes n⁺-type embedded layer 17 of a stripe pattern with the MIS GTO of FIG. 2 as a base. FIG. 13C shows a superimposition pattern of the respective impurity concentration layers and FIGS. 13A and 13B are cross-sectional views corresponding to the positions A—A' and B—B' of FIG. 13C. n+-Type embedded layer 17 is formed, in a multi-striped fashion, over a range of the interface between second base layer 3 and p⁻-type layer 8. A plurality of stripe-like p+-type layers 19 are formed at the interface between second base layer 3 and p⁻-type layer 8 such that each is located between n+-type embedded layers 17.

Even in this embodiment the same advantages as set out in connection with the previous embodiments are obtained. In this embodiment, if the stripe width W₁ of p+-type embedded layer 19 is set to a small value, a sufficiently low on-state voltage is obtained since the turn-anode current flows through the whole area of the element. Furthermore, the effective width of second emitter layer 4 comes to a value W₂ as shown in FIG. 13C by providing stripe-like p+-type embedded layer 19. As a result, the peak turn-off current of the MIS GTO is increased and thus the turn-off time becomes shorter.

Though not shown in FIGS. 1, 3 and 4, a stripe-like n+-type embedded layer can be formed, as in the embodiment of FIG. 13, with the MIS GTO of FIGS. 1, 3 and 4 as a base structure.

In the respective embodiments, an explanation has been given of the main structure of the MIS GTO, and now an effective junction termination technique will be explained below in connection with this invention. If a counter-doping method is to be used for forming a low impurity concentration layer, then it is possible to selectively form the low impurity concentration layer. In this case, a guard-ring structure as used in an ordinary planar device can directly be used as a junction termination structure. If, on the other hand, an epitaxial growth method or a direct bonding method is utilized for forming the low impurity concentration layer, then special care must be excercised because it is not possible to selectively form the low impurity concentration layer.

Figure 14:
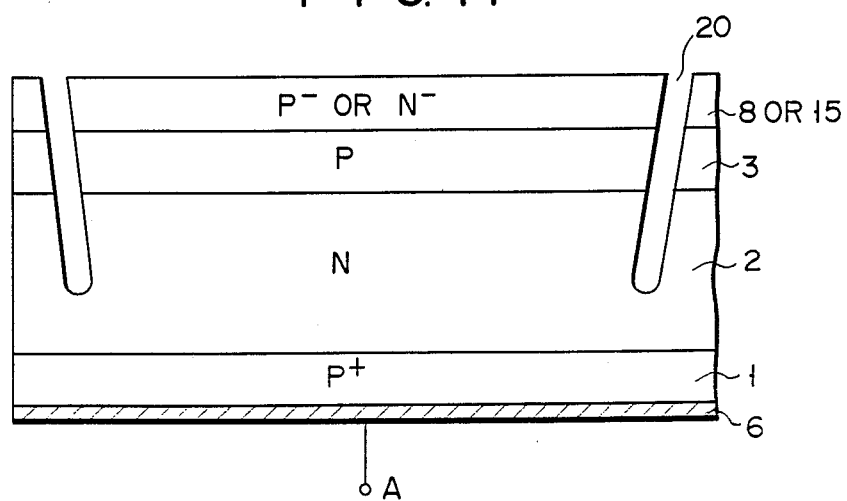
FIGS. 14 to 17, each, show a preferable junction termination structure applied to the MIS GTO of this invention.

FIG. 14 shows one junction termination structure. In this case, p⁻-type layer 8 or n⁻-type layer 15 is formed as a low impurity concentration layer on second base layer 3 and then bevel 20 is formed around that element by a beveling technology, i.e., a method for forming a large discrete semiconductor element.

Figure 15:
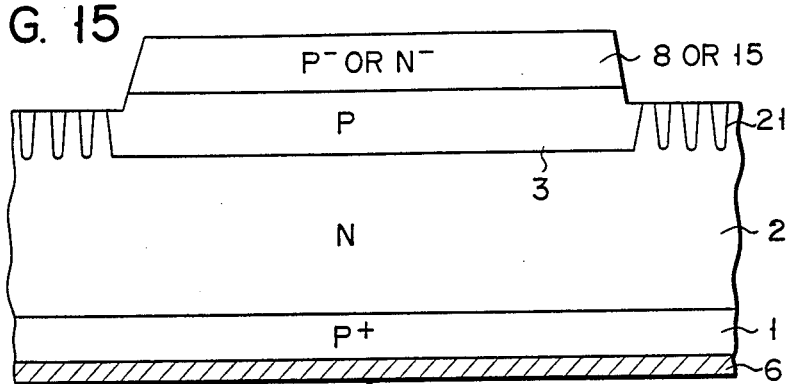

FIG. 15 is another form of a junction termination structure. In this case, second base layer 3 is selectively diffusion-formed in the surface portion of first base layer 2 and then p⁻-type layer 8 or n⁻-type layer 15 is formed as a low impurity concentration layer on the whole surface of second base layer 3. Thereafter, the low impurity concentration layer is etched away at a location around a wafer to expose first base layer 2 where guard-ring layer 21 is formed.

Figure 16:
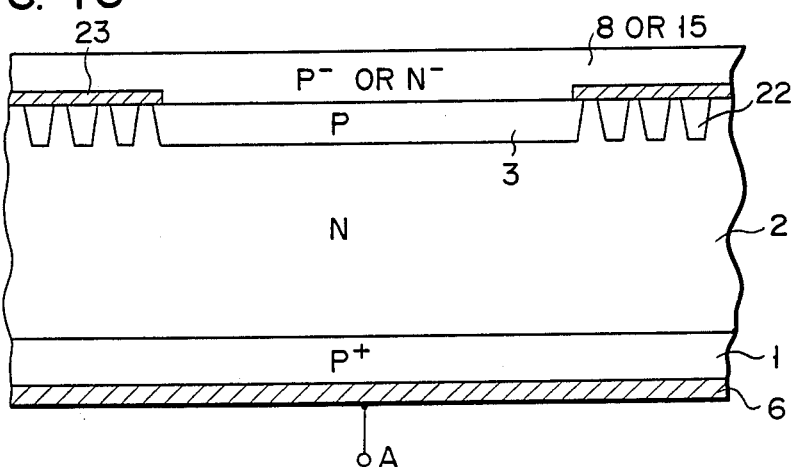

FIG. 16 shows another form of a junction termination structure in which case a guard-ring layer is formed before the formation of a low impurity concentration layer. In this structure, second base layer 3 is selectively diffusion-formed in the surface portion of first base layer 2 and guard-ring layer 22 is formed outside the second base layer 3. Then the section of the guard-ring layer 22 is covered with insulating film 23 and p⁻-type layer 8 or n⁻-type layer 15 is formed as a low impurity concentration layer on the whole surface of the resultant structure.

Figure 17:
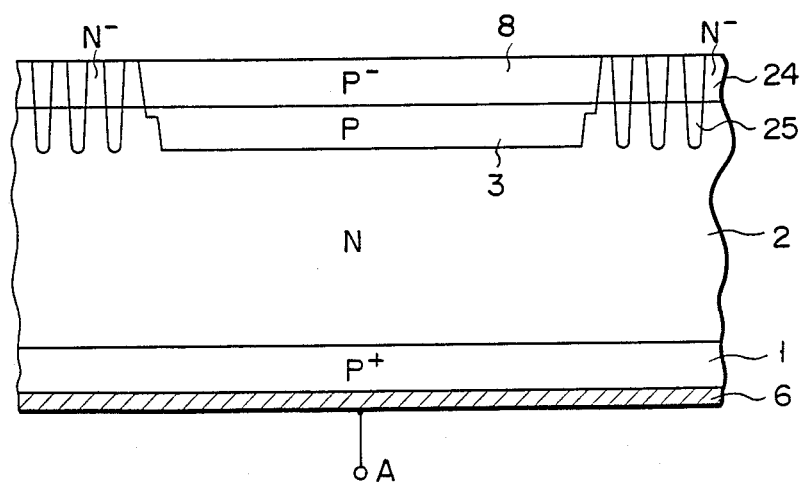

FIG. 17 shows another form of a junction termination structure. In this form, second base layer 3 and low impurity concentration layer on second base layer 3 are both formed by a selective diffusion method. That is, the second base layer 3 is selectively formed in the surface portion of first base layer 2 and n⁻-type layer 24 is epitaxially grown on the whole surface of the wafer. Then p⁻-type layer 8 is so formed by the selective diffusion method as to reach second base layer 3. Then guard-ring layer 25 is formed outside second base layer 3.

This invention is not restricted to the aforementioned embodiment. In the embodiment, for example, p+-type layer 12 is formed as a low-resistance layer for lowering the aforementioned resistance $R_S$ on the current bypass at the turn-off time. p+-type layer 12 is, for example, an impurity-doped layer for connecting the drain of a turn-off MIS transistor region to the second base layer. The formation of p+-type layer 12 is important in the sense that high-resistance p⁻-type layer 8 or n⁻-type layer 15 is formed on second base layer 3. In this case, a p+-type layer may be selectively formed in the surface portion of second base layer 3 to lower a lateral resistance across p+-type layer 12 and second emitter layer 4, to be formed at a later step. This arrangement is useful in an attempt to further lower the resistance $R_S$.

In this embodiment, use can be made of a metal electrode in place of p+-type layer 12. Stated in more detail, a groove is formed by etching in the area of p+-type layer 12 of p⁻-type layer 8 or n⁻-type layer 15 and the metal electrode is embedded for ohmic contact with second base layer 3.

Although no plane pattern for elements has been referred to in the aforementioned embodiments, a second emitter pattern for constituting the GTO elements may be of a striped, a circular, or other forms of island patterns.

Although in the aforementioned embodiments first and second conductivity types have been explained as being p- and n-type, respectively, first and second conductivity types may be of n- and p-type, respectively.

As set out above, according to this invention the second base layer and a channel region for the turn-off MIS transistors are formed as different impurity concentration layers. For this reason, the threshold value of the turn-off MIS transistor can be set to an optimal value without being restricted by the other GTO characteristics. It is possible to obtain an MIS GTO of a smaller on-state voltage and greater surge current capability without the sacrifice of a better turn-off characteristic.

What is claimed is:

1. An MIS controlled gate turn-off thyristor comprising:
   a first emitter layer of a first conductivity type;
   a first base layer of a second conductivity type forming a pn junction relative to the first emitter layer;
   a second base layer of the first conductivity type forming a pn junction relative to the first base layer;
   a low impurity concentration layer formed on the second base layer;
   a second emitter layer of the second conductivity type formed such that it extends, through the low impurity concentration layer, into the second base layer;
   first and second ohmic electrodes in contact with the first and second emitter layers, respectively; and
   an MIS transistor formed in the surface portion of the low impurity concentration layer and having source and drain regions, one of which is connected to the second ohmic electrode and the other of which is connected through a low resistance layer to the second base layer to allow the second base layer to be short-circuited to the second emitter layer.

2. The MIS controlled gate turn-off thyristor according to claim 1, in which a high impurity concentration layer of the second conductivity type continuous with said second emitter is formed at an interface between said second base layer under an area of said MIS transistor and said low impurity concentration layer.

3. The MIS controlled gate turn-off thyristor according to claim 1, in which a high impurity concentration layer of the second conductivity type continuous with said second emitter layer is formed locally at an interface of said second base layer under an area of said MIS transistor and said low impurity concentration layer.

4. The MIS controlled gate turn-off thyristor according to claim 1, in which a high impurity concentration layer of the second conductivity type is formed over a whole interface between said second base layer and said low impurity concentration layer such that it is continuous with said second emitter layer and has a plurality of windows at said low resistance layer.

5. The MIS controlled gate turn-off thyristor according to claim 1, in which a high impurity concentration layer of the second conductivity type is formed at an interface between said second base layer and said low impurity concentration layer such that it is continuous and has a pattern of a plurality of stripes.

6. The MIS controlled gate turn-off thyristor according to claim 1, in which said low impurity concentration layer is of the first conductivity type and said MIS transistor is of a second channel conductivity type where the surface portion of said low impurity concentration layer acts as a channel region.

7. The MIS controlled gate turn-off thyristor according to claim 1, in which said low impurity concentration layer is comprised of a first low impurity concentration layer of the first conductivity type formed on a whole surface of said second base layer and a second low impurity concentration layer of the second conductivity type selectively formed in the surface portion of said first low impurity concentration layer, and said MIS transistor is of a first channel conductivity type in which the surface portion of said second low impurity concentration layer acts as a channel region.

8. The MIS controlled gate turn-off thyristor according to claim 1, in which said low impurity concentration layer is of the second conductivity type and said MIS transistor is of the first channel conductivity type in which a surface portion of said low impurity concentration layer acts as a channel region.

9. The MIS controlled gate turn-off thyristor according to claim 1, in which said low impurity concentration layer is comprised of a first low impurity concentration layer of the second conductivity type formed on a whole surface of said second base layer and a second low impurity concentration layer of the first conductivity type selectively formed in the surface portion of said first low impurity concentration layer and said MIS transistor is of the second channel conductivity type in which the surface portion of said second low impurity concentration layer acts as a channel region.

10. The MIS controlled gate turn-off thyristor according to claim 1, in which said low resistance layer is a high impurity concentration semiconductor layer of the first conductivity type.

11. The MIS controlled gate turn-off thyristor according to claim 1, in which said low resistance layer is formed of an on-gate electrode in ohmic contact with said low resistance layer and with one of said source and drain regions of said MIS transistor.

* * * * *